(12) United States Patent
Lee et al.

(10) Patent No.: US 11,820,650 B2
(45) Date of Patent: Nov. 21, 2023

(54) MICROELECTROMECHANICAL APPARATUS HAVING HERMITIC CHAMBER

(71) Applicant: INDUSTRIAL TECHNOLOGY RESEARCH INSTITUTE, Hsinchu (TW)

(72) Inventors: Bor-Shiun Lee, New Taipei (TW); Ming-Fa Chen, Taoyuan (TW); Yu-Wen Hsu, Tainan (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 469 days.

(21) Appl. No.: 16/882,039

(22) Filed: May 22, 2020

(65) Prior Publication Data

US 2021/0198101 A1    Jul. 1, 2021

(30) Foreign Application Priority Data

Dec. 30, 2019    (TW) .................. 108148275

(51) Int. Cl.
*B81B 7/02*    (2006.01)
*B81C 1/00*    (2006.01)
(Continued)

(52) U.S. Cl.
CPC ............ *B81B 7/02* (2013.01); *B81C 1/00246* (2013.01); *G01K 7/186* (2013.01);
(Continued)

(58) Field of Classification Search
CPC .............. B81B 7/02; B81B 2201/0264; B81B 2201/0278; B81B 7/0096; B81C 1/00246;
(Continued)

(56) References Cited

U.S. PATENT DOCUMENTS 5,357,464 A * 10/1994 Shukuri ................ G11C 11/401
365/185.21
9,459,224 B1   10/2016 Cheng et al.
(Continued)

FOREIGN PATENT DOCUMENTS

CN    103281048 A    9/2013
CN    107238451 A    10/2017
(Continued)

OTHER PUBLICATIONS

Fedder et al., Technologies for Cofabricating MEMS and Electronics, Technology Research Institute, vol. 96, No., Feb. 2008.
(Continued)

*Primary Examiner* — Edward Chin
(74) *Attorney, Agent, or Firm* — Maschoff Brennan

(57) ABSTRACT

The disclosure relates to a microelectromechanical apparatus including a substrate, a stationary electrode, a movable electrode, and a heater. The substrate includes an upper surface, an inner bottom surface, and an inner side surface. The inner side surface surrounds and connects with the inner bottom surface. The inner side surface and the inner bottom surface define a recess. The stationary electrode is disposed on the inner bottom surface. The movable electrode covers the recess. The movable electrode, the inner bottom surface, and the inner side surface define a hermetic chamber. The heater is disposed on the movable electrode and located above the hermetic chamber.

21 Claims, 5 Drawing Sheets

(51) Int. Cl.
*G01L 19/00* (2006.01)
*G01K 7/18* (2006.01)
*G01N 27/22* (2006.01)

(52) U.S. Cl.
CPC ........ *G01L 19/0092* (2013.01); *G01N 27/223* (2013.01); *B81B 2201/0264* (2013.01); *B81B 2201/0278* (2013.01)

(58) Field of Classification Search
CPC ... G01K 7/186; G01L 19/0092; G01L 9/0073; G01N 27/223; G01N 27/12
See application file for complete search history.

(56) References Cited

U.S. PATENT DOCUMENTS

| | | | |
|---|---|---|---|
| 9,845,236 | B2 | 12/2017 | Yu et al. |
| 10,280,074 | B2 | 5/2019 | Gogoi |
| 10,317,357 | B2 | 6/2019 | Le Neel et al. |
| 11,022,576 | B2 * | 6/2021 | Ali .......................... G01N 27/16 |
| 2007/0171257 | A1 | 7/2007 | Yang |
| 2008/0144384 | A1 * | 6/2008 | Pham ................. G11C 16/0483 257/E27.081 |
| 2009/0283821 | A1 * | 11/2009 | Nakao .................... H10B 41/30 257/E21.21 |
| 2012/0024075 | A1 * | 2/2012 | Peng .................... G01L 9/0073 73/724 |
| 2014/0125359 | A1 * | 5/2014 | El-Gamal ................. G01L 9/12 324/664 |
| 2016/0002026 | A1 * | 1/2016 | Chodavarapu ....... H03H 9/0561 257/254 |
| 2016/0006414 | A1 * | 1/2016 | Chodavarapu ....... H03H 9/2436 310/309 |
| 2017/0023520 | A1 * | 1/2017 | Chey ...................... G08B 21/16 |
| 2017/0188413 | A1 * | 6/2017 | Hsu ........................ G05D 23/24 |
| 2017/0276561 | A1 | 9/2017 | Shimada |
| 2018/0172532 | A1 * | 6/2018 | Huang .................. G01L 9/0054 |
| 2018/0349762 | A1 * | 12/2018 | Lee ........................ H10B 41/70 |
| 2019/0204281 | A1 | 7/2019 | Choi et al. |
| 2020/0220024 | A1 * | 7/2020 | Sharma ................. H01L 29/517 |
| 2020/0407218 | A1 * | 12/2020 | Chodavarapu ....... G01L 9/0042 |
| 2021/0063836 | A1 * | 3/2021 | Patterson ............. G05B 19/042 |
| 2021/0148845 | A1 * | 5/2021 | König ................... B81B 7/0029 |
| 2021/0204071 | A1 * | 7/2021 | Pedersen ............... B81B 7/0087 |

FOREIGN PATENT DOCUMENTS

| | | | | |
|---|---|---|---|---|
| JP | 05110016 | A | * | 4/1993 |
| TW | 200728605 | A | | 8/2007 |
| TW | 201723715 | A | | 7/2017 |
| TW | M575864 | U | | 3/2019 |
| WO | WO-2019066927 | A1 | * | 4/2019 ....... H01L 27/10814 |
| WO | WO-2021041709 | A1 | * | 3/2021 ........ B01L 3/502715 |

OTHER PUBLICATIONS

Hoof et al., Enabling poly-SiGe MEMS scaling by improving anchor strength and resistance, Microelectronic Engineering 88 (2011) 2420-2423.

Witvrouw et al., Poly-SiGe, a superb material for MEMS, Mat. Res. Soc. Symp. Proc. vol. 782, 2004.

TW Office Action in Application No. 108148275 dated Sep. 25, 2020.

* cited by examiner

MICROELECTROMECHANICAL APPARATUS HAVING HERMITIC CHAMBER

CROSS-REFERENCE TO RELATED APPLICATIONS

This non-provisional application claims priority under 35 U.S.C. § 119(a) on Patent Application No(s). 108148275 filed in R.O.C. Taiwan on Dec. 30, 2019, the entire contents of which are hereby incorporated by reference.

TECHNICAL FIELD

The disclosure relates to a microelectromechanical apparatus having a hermitic chamber, adaptive for sensing the concentration, gas pressure, humidity, and temperature of gases in the environment.

BACKGROUND

In the past, when there was a need to sense an environment status, devices (e.g., temperature meter, humidity meter) for sensing environment would be employed to sense the environment. In the future, sensors with different sensing functions can be integrated into a smart electronic device, such as a smartphone or smart home appliances. Therefore, those in the related fields have developed a microelectromechanical apparatus that can sense the environment and integrate such a microelectromechanical apparatus into a smart electronic device. When the user or the control host of the smart home needs to obtain the environmental status of the smart electronic device, it can control such a microelectromechanical apparatus that can sense the environment for sensing the environmental status.

SUMMARY

One exemplary embodiment of the disclosure provides a microelectromechanical apparatus including a substrate, a stationary electrode, a movable electrode, and a heater. The substrate includes an upper surface, an inner bottom surface, and an inner side surface. The inner side surface surrounds and connects with the inner bottom surface. The inner side surface and the inner bottom surface define a recess. The stationary electrode is disposed on the inner bottom surface. The movable electrode covers the recess. The movable electrode, the inner bottom surface, and the inner side surface define a hermetic chamber. The heater is disposed on the movable electrode and located above the hermetic chamber.

Another exemplary embodiment of the disclosure provides a microelectromechanical apparatus including a substrate, a pressure sensor, a gas sensor, and a temperature sensor. The substrate includes an upper surface, an inner bottom surface, and an inner side surface. The inner side surface surrounds and connects with the inner bottom surface. The inner side surface and the inner bottom surface define a recess. The pressure sensor is disposed on the recess and includes a stationary electrode and a movable electrode. The stationary electrode is disposed on the inner bottom surface. The movable electrode covers the recess. The movable electrode, the inner bottom surface, and the inner side surface define a hermetic chamber. The gas sensor is disposed on the pressure sensor and includes a heater, an electrical insulation layer, a sensing electrode, and a sensing material layer. The heater is disposed on the movable electrode and located above the hermetic chamber. The electrical insulation layer is disposed between the heater and the movable electrode. The sensing electrode is disposed above the heater and electrically insulated from the heater. The sensing material layer covers the sensing electrode. The temperature sensor is disposed on the pressure sensor. The temperature sensor is disposed on the movable electrode and located above the hermetic chamber. The electrical insulation layer is disposed between the temperature sensor and the movable electrode.

DETAILED DESCRIPTION

Figure 1:
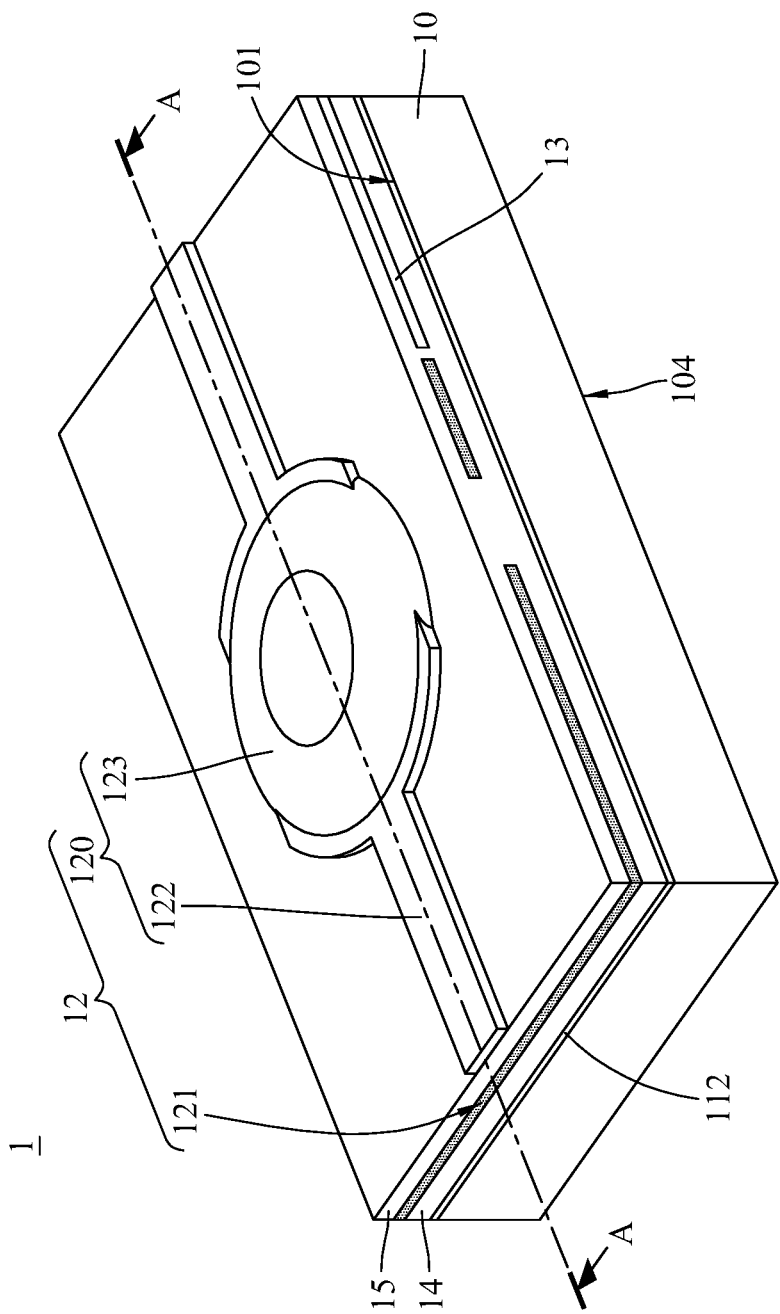
FIG. 1 illustrates a perspective view of a microelectromechanical apparatus according to one exemplary embodiment of the disclosure.

In the following detailed description, for purposes of explanation, numerous specific details are set forth in order to provide a thorough understanding of the disclosed embodiments. It will be apparent, however, that one or more exemplary embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Various changes can be made as long as it does not depart from the spirit of the disclosure. The spatial terms, such as "on", "below", "front", "rear", "above" are for illustration and not intended to limit the disclosure.

Figure 2:
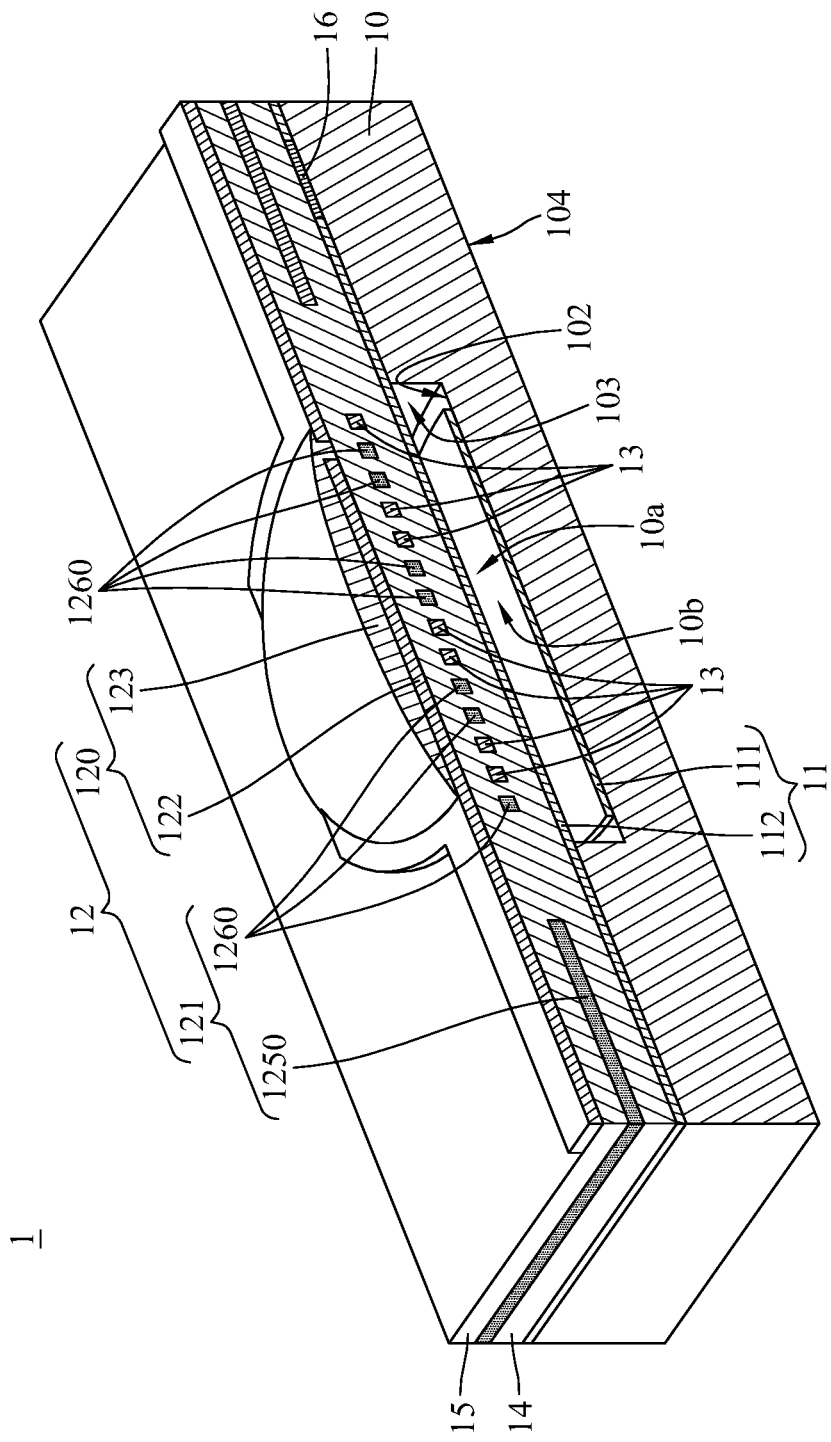
FIG. 2 illustrates a cross-sectional view of the microelectromechanical apparatus taken along line A-A of FIG. 1.
Figure 3:
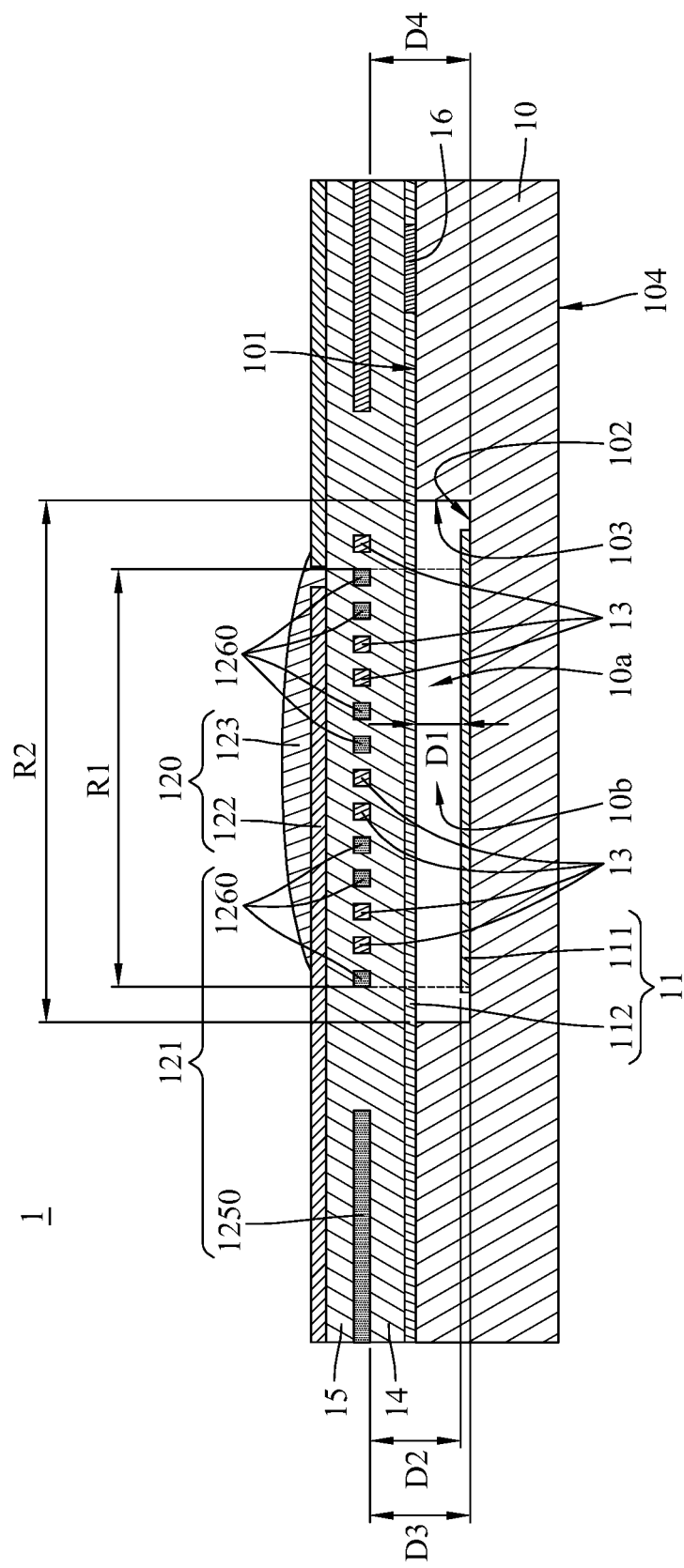
FIG. 3 illustrates a cross-sectional side view of the microelectromechanical apparatus taken along line A-A of FIG. 1.
Figure 4:
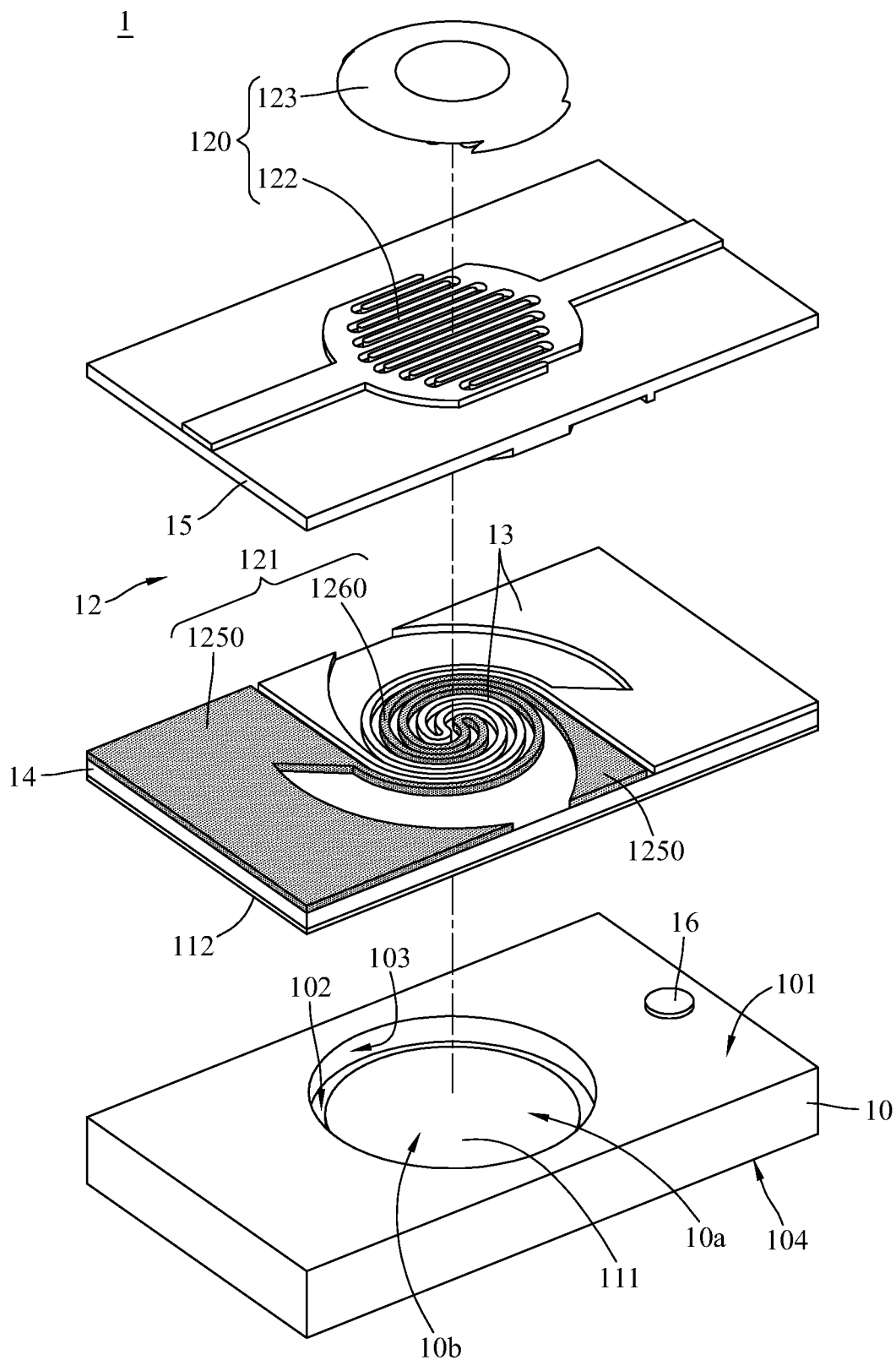
FIG. 4 illustrates a perspective exploded view of the microelectromechanical apparatus in FIG. 1.

Please refer to FIG. 1, FIG. 2, FIG. 3, and FIG. 4. FIG. 1 illustrates a perspective view of a microelectromechanical apparatus according to one exemplary embodiment of the disclosure. FIG. 2 illustrates a cross-sectional view of the microelectromechanical apparatus taken along line A-A of FIG. 1. FIG. 3 illustrates a side view of the microelectromechanical apparatus taken along line A-A of FIG. 1. FIG. 4 illustrates a perspective exploded view of the microelectromechanical apparatus in FIG. 1.

As shown in FIG. 1 and FIG. 2, in this exemplary embodiment, a microelectromechanical apparatus 1 is provided, the microelectromechanical apparatus 1 includes a substrate 10, a pressure sensor 11, a gas sensor 12, a temperature sensor 13, an electrical insulation layer 14, an electrical insulation layer 15, an integrated circuit 16.

The substrate 10 includes an upper surface 101, an inner bottom surface 102, and an inner side surface 103. The inner side surface 103 surrounds and connects with the inner bottom surface 102. The inner bottom surface 102 and the inner side surface 103 define a recess 10a.

The pressure sensor 11 is disposed on the recess 10a. The pressure sensor 11 includes a stationary electrode 111 and a movable electrode 112. The stationary electrode 111 is disposed on the inner bottom surface 102. The movable electrode 112 is disposed on the upper surface 101 and covers the recess 10a. The movable electrode 112, the inner bottom surface 102, and the inner side surface 103 define a hermetic chamber 10b. In this exemplary embodiment, the hermetic chamber 10b may be a vacuum chamber, but the disclosure is not limited thereto. In some other exemplary embodiments, the hermetic chamber 10b may contain a gas, and the gas pressure of the gas is smaller than that of the ambient gas around the microelectromechanical apparatus 1.

In this exemplary embodiment, when the ambient gas pressure around the movable electrode 112 changes, a distance D1 between the movable electrode 112 and the stationary electrode 111 is therefore changed. Due to the change of the distance D1, the change in the capacitance value between the movable electrode 112 and the stationary electrode 111 can be obtained. It can estimate the change of the ambient gas pressure by processing the signal of the change of the capacitance value.

In addition, the gas sensor 12 is disposed on the pressure sensor 11. The gas sensor 12 includes a sensing module 120 and a heater 121. The sensing module 120 includes at least one sensing electrode 122 and a sensing material layer 123.

As shown in FIG. 3 and FIG. 4, the heater 121 is disposed on the movable electrode 112 and located above the hermetic chamber 10b via the electrical insulation layer 14. That is, the electrical insulation layer 14 is disposed between the heater 121 and the movable electrode 112 and is connected to the heater 121 and the movable electrode 112. Thus, the heater 121 and the movable electrode 112 are electrically insulated from each other. Since the heater 121 is disposed on the movable electrode 112, the heater 121 is able to provide the heat energy directly to the movable electrode 112 without additional heat transfer path, thereby reducing heat energy loss. Therefore, when the movable electrode 112 is required to operate in a constant temperature environment, the power consumed by the heater 121 can be decreased.

The heater 121 includes a conductive area 1250 and a heating area 1260. The heating area 1260 of the heater 121 is, for example, a planar spiral heating coil. When the ambient gas pressure around the movable electrode 112 changes, a distance D2 between the heater 121 and the stationary electrode 111 is therefore changed as well. As such, the heater 121 is movable with the movable electrode 112, thus the heat transfer path between the heater 121 and the movable electrode 112 is not changed. The heater 121 is, therefore, able to directly provide the heat energy to the movable electrode 112 and to reduce the heat energy loss, thereby decreasing the power consumed by the heater 121.

Please refer to FIG. 3, the projection of the heating area 1260 of the heater 121 onto the inner bottom surface 102 falls within a range R1, and the range R1 is located within a boundary range R2 of the inner bottom surface 102. Therefore, the hermetic chamber 10b has a sufficient range to correspond to the heating area 1260 of the heater 121. The hermetic chamber 10b is an excellent hermitic chamber. Since the hermetic chamber 10b has a range corresponding to the heating area 1260 of the heater 121, the heat energy of the heating area 1260 is not easily dissipated so as to achieve a thermal insulation effect, thereby decreasing the power consumed by the heater 121. In addition, to obtain the optimal thermal insulation effect, the hermetic chamber 10b is a vacuum hermetic chamber.

In addition, the hermetic chamber 10b has a sufficient room for the deformation of the movable electrode 112.

Therefore, the distance D1 between the movable electrode 112 and the stationary electrode 111 is easily changed with the change of the ambient gas pressure and thus the sensitivity of the pressure sensor 11 to sense the change of the ambient gas pressure is improved Please refer to FIG. 1 and FIG. 2, the sensing module 120 of the gas sensor 12 is disposed above the heater 121, and the heater 121 is disposed between the sensing module 120 and the movable electrode 112. The sensing electrode 122 is disposed above the heater 121 and is electrically insulated from the heater 121 via the electrical insulation layer 15. That is, the electrical insulation layer 15 is disposed between the heater 121 and the sensing electrode 122. It makes the heater 121 and the sensing electrode 122 electrically insulated from each other. The sensing electrode 122 is, for example, a pair of interdigitated electrodes. The sensing material layer 123 covers the sensing electrode 122. The sensing module 120 is able to possess a specific sensing function as a specific type of the sensing material layer 123 is used. For example, in this exemplary embodiment, the sensing material layer 123 is a material layer for sensing gas, such that the sensing module 120 possesses the function of sensing gas. In another exemplary embodiment not shown in the drawings, the sensing material layer 123 is a material layer for sensing humidity, such that the sensing module 120 possesses the function of sensing humidity.

As discussed above, since the gas sensor 12 is stacked above the pressure sensor 11, the footprint area of the microelectromechanical apparatus 1 can be reduced. And since the heater 121 is disposed between the sensing module 120 and the movable electrode 112, the sensing module 120 and the pressure sensor 11 are able to share one heater 121, which further reduces the footprint area of the microelectromechanical apparatus 1. The heater 121 is covered by the sensing module 120 so that it is not exposed to the atmosphere, thereby reducing the heat energy loss resulted from heat convection and thus decreasing the power consumed by the heater 121.

As shown in FIG. 2, the temperature sensor 13 is disposed on the pressure sensor 11 and the temperature sensor 13 is disposed between the sensing module 120 and the movable electrode 112. The temperature sensor 13 is disposed on the movable electrode 112 and located above the hermetic chamber 10b via the electrical insulation layer 14. That is, the electrical insulation layer 14 is disposed between the temperature sensor 13 and the movable electrode 112 and connected with the temperature sensor 13 and the movable electrode 112. It makes the temperature sensor 13 and the movable electrode 112 electrically insulated from each other. As shown in FIG. 4, the temperature sensor 13 is, for example, a planar spiral thermal resistor. The temperature sensor 13 is in a spiral shape that is arranged adjacent to the heating area 1260 of the heater 121.

By disposing the temperature sensor 13 on the movable electrode 112, the temperature of the movable electrode 112 is accurately measured for the calibration of the physical quantity (e.g., gas pressure) measured by the movable electrode 112, thereby improving the measurement accuracy of the physical quantity. By disposing the temperature sensor 13 between the sensing module 120 and the movable electrode 112, the sensing module 120 and the pressure sensor 11 can share one temperature sensor 13, which can reduce the footprint area of the microelectromechanical apparatus 1.

As shown in FIG. 3, a distance D3 between the temperature sensor 13 and the inner bottom surface 102 is substantially equal to a distance D4 between the heater 121 and the inner bottom surface 102, and the temperature sensor 13 and the heater 121 are electrically insulated from each other. That is, the heater 121 and the temperature sensor 13 can be patterned from the same conductive layer, such that they can be produced using the same MEMS process, which can reduce the complexity of the manufacturing process and reduce the manufacturing cost. The sensing module 120 is disposed above the temperature sensor 13, and the temperature sensor 13 is disposed between the sensing module 120 and the movable electrode 112.

The integrated circuit 16 is disposed on the upper surface 101. The integrated circuit 16 is electrically connected to the stationary electrode 111, the movable electrode 112, the heater 121, the temperature sensor 13, and the sensing electrode 122. The integrated circuit 16 is able to receive a first electrical signal sensed by the temperature sensor 13 and a second electrical signal sensed by the stationary electrode 111 and the movable electrode 112 to calibrate a pressure value and thus which can be used to obtaining an accurate gas pressure value.

Specifically, the integrated circuit 16 is able to receive a first electrical signal (e.g., resistance value) from the temperature sensor 13 for calculating the temperature value of the ambient temperature. In addition, the integrated circuit 16 is able to receive a second electrical signal (e.g., capacitance value) related to the distance D1 between the stationary electrode 111 of the pressure sensor 11 and the movable electrode 112 of the pressure sensor 11. The integrated circuit 16 receives the second electrical signal for calculating an initial pressure value of the ambient gas pressure. Then, the integrated circuit 16 is able to calibrate the initial pressure value by the calculated temperature value and a data table stored in the integrated circuit 16 to eliminate the deviation of the second electrical signal resulted from the change of the ambient temperature.

Further, the second electrical signal can be easily deviated due to the temperature change of the pressure sensor 11 and results in a deviation of gas pressure value. For this reason, the integrated circuit 16 is used to control the heater 121 to heat the pressure sensor 11, such that the pressure sensor 11 is able to operate in a stable ambient temperature condition. In addition, the integrated circuit 16 is able to receive the first electrical signal from the temperature sensor 13 at the same time, and then control the heat energy provided by the heater 121 according to the feedback of the real-time temperature data, such that the pressure sensor 11 is able to operate in a stable ambient temperature condition. Since the temperature of the pressure sensor 11 is reached at the target temperature and is maintained in a stable ambient temperature condition, a deviation of the second electrical signal can be reduced to obtain a more accurate pressure value.

The method by which the sensing module 120 senses the gas in the environment is introduced in the following paragraphs. The sensing module 120 usually operates at a specific working temperature. The integrated circuit 16 controls the heater 121 to heat the sensing module 120. By using the feedback system, the integrated circuit 16 receives the first electrical signal from the temperature sensor 13 to keep the temperature of the sensing module 120 stay at the working temperature. Then the integrated circuit 16 receives the electrical signal from the sensing module 120 for obtaining a status of the gas which is corresponding to the sensing material layer 123. In this exemplary embodiment, the sensing material layer 123 is a specific gas sensing layer configured to sense the concentration of the specific gas. The integrated circuit 16 is able to determine the concentration of the specific gas according to the electrical signal (e.g., resistance value) from the sensing electrode 122 of the sensing module 120. In another exemplary embodiment, the sensing material layer 123 is a humidity sensing layer configured to sense the humidity of another specific gas. The integrated circuit 16 is able to determine the humidity of another specific gas according to the electrical signal (e.g., resistance value) from the sensing electrode 122 of the sensing module 120.

As discussed above, the pressure sensor 11 and the sensing module 120 can share the same heater 121, the same temperature sensor 13 and feedback system to maintain the pressure sensor 11 at a specific temperature stably and to maintain the sensing module 120 at another specific temperature stably. In addition, the hermetic chamber 10b is able to provide a room for the movement of the movable electrode 112 and can become a hermitic chamber for effectively reducing the power consumed by the heater 121.

Figure 5:
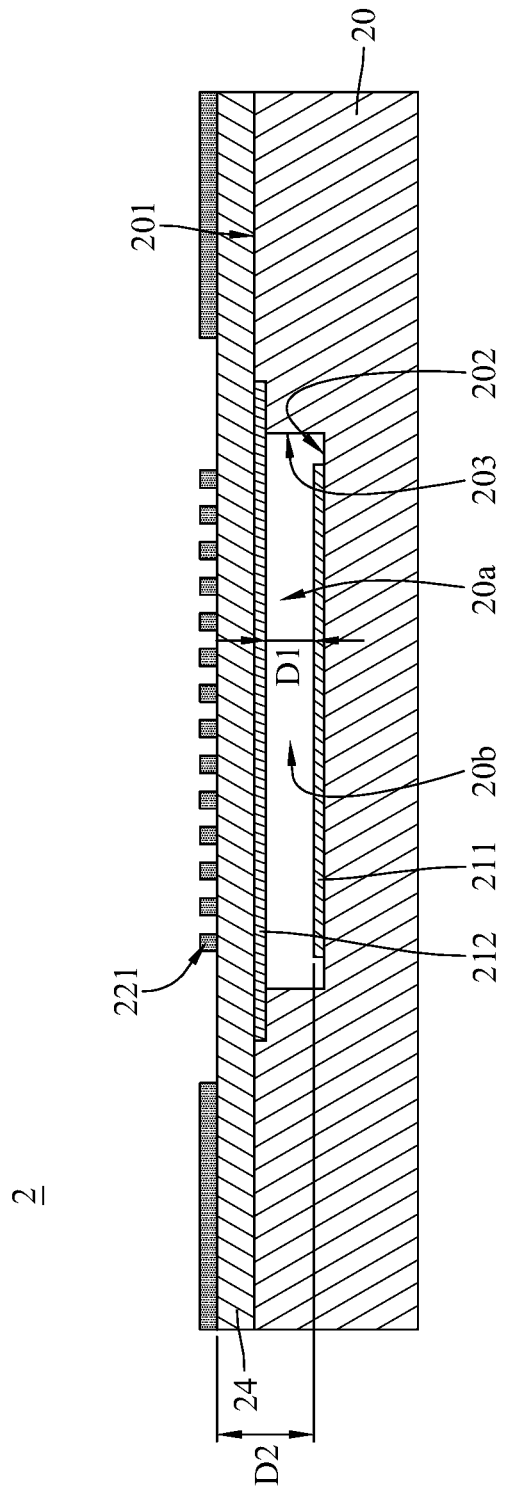
FIG. 5 illustrates a cross-sectional side view of a microelectromechanical apparatus according to another exemplary embodiment of the disclosure.

Please refer to FIG. 5. FIG. 5 illustrates a cross-sectional side view of a microelectromechanical apparatus according to another exemplary embodiment of the disclosure. In this exemplary embodiment, a microelectromechanical apparatus 2 is provided. The microelectromechanical apparatus 2 includes a substrate 20, a stationary electrode 211, a movable electrode 212, a heater 221, and an electrical insulation layer 24.

The substrate 20 includes an upper surface 201, an inner bottom surface 202, and an inner side surface 203. The inner side surface 203 surrounds and connects with the inner bottom surface 202. The inner bottom surface 202 and the inner side surface 203 define a recess 20a. The stationary electrode 211 is disposed on the inner bottom surface 202. The movable electrode 212 covers the recess 20a. The movable electrode 212, the inner bottom surface 202, and the inner side surface 203 define a hermetic chamber 20b. The heater 221 is disposed on the movable electrode 112 and located above the hermetic chamber 20b via the electrical insulation layer 24. That is, the electrical insulation layer 24 is disposed between the heater 221 and the movable electrode 212 and is connected with the heater 221 and the movable electrode 212. It makes the heater 221 and the movable electrode 212 electrically insulated from each other.

When the ambient gas pressure around the movable electrode 212 changes, a distance D1 between the movable electrode 212 and the stationary electrode 211 is therefore changed, and a distance D2 between the heater 221 and the stationary electrode 211 is therefore changed as well. Due to the change of the distance D1, the change in the capacitance value between the movable electrode 212 and the stationary electrode 211 can be obtained. By signal processing, it is possible to measure the change of the ambient gas pressure according to the change of the capacitance value. Since the heater 221 is able to heat the movable electrode 212 to a specific temperature and keep the movable electrode 212 at a stable temperature, it is possible to prevent the measured capacitance from deviation due to change of the ambient temperature.

Since the heater 221 is disposed on the movable electrode 212 and is able to move with the movable electrode 212, the heater 221 is able to provide the heat energy directly to the movable electrode 212. Therefore, the heat transfer path between the heater 221 and the movable electrode 212 can be a shortest path to reduce the heat energy loss, thereby reducing the power consumed by the heater 221. The hermetic chamber 20b is a hermitic chamber, which can make the heat energy generated by the heater 221 is not easily dissipated, thereby decreasing the power consumed by the heater 221.

According to the microelectromechanical apparatus as discussed in the above exemplary embodiments of the disclosure, the movable electrode and the stationary electrode are used to measure the gas pressure. While measuring the gas pressure, the movable electrode and the stationary electrode are heated to a specific stable temperature, thereby improving the stability and accuracy of the measured pressure value. In addition, in the microelectromechanical apparatus of the exemplary embodiment of the disclosure, the gas sensor is stacked above the pressure sensor in the thickness direction to reduce the footprint area of the microelectromechanical apparatus. In order to further reduce the footprint area of the microelectromechanical apparatus, the gas sensor (or humidity sensor) and the pressure sensor can share the same heater and the same temperature sensor which are disposed between the gas sensor (or humidity sensor) and the pressure sensor. Also, the hermetic chamber provides room for the movement of the movable electrode, the hermetic chamber is also used as a hermitic chamber configured to decrease the power consumed by the heater.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A microelectromechanical apparatus, comprising:
   a substrate, comprising:
     an upper surface;
     an inner bottom surface; and
     an inner side surface, surrounding and connecting with the inner bottom surface, wherein the inner side surface and the inner bottom surface define a recess formed by being recessed downwards from the upper surface;
   a stationary electrode, disposed on the inner bottom surface;
   an electrically conductive movable electrode, covering the recess, wherein the electrically conductive movable electrode, the inner bottom surface, and the inner side surface define a hermetic chamber; and
   a heater, disposed on the electrically conductive movable electrode and located above the hermetic chamber;
   wherein the microelectromechanical apparatus further comprises a temperature sensor disposed on the electrically conductive movable electrode;
   wherein the microelectromechanical apparatus further comprises an electrical insulation layer disposed between the heater and the electrically conductive movable electrode, and the electrical insulation layer is disposed between the temperature sensor and the electrically conductive movable electrode; and
   wherein the microelectromechanical apparatus further comprises a sensing module configured to sense gas or humidity, the sensing module is disposed above the heater, and the heater is disposed between the sensing module and the electrically conductive movable electrode.

2. The microelectromechanical apparatus according to claim 1, wherein the electrically conductive movable electrode is disposed on the upper surface.

3. The microelectromechanical apparatus according to claim 1, wherein the hermetic chamber is a vacuum hermetic chamber.

4. The microelectromechanical apparatus according to claim 1, wherein a projection of a heating area of the heater onto the inner bottom surface is located within a boundary range of the inner bottom surface.

5. The microelectromechanical apparatus according to claim 1, wherein the temperature sensor is located above the hermetic chamber.

6. The microelectromechanical apparatus according to claim 5, wherein a distance between the temperature sensor and the inner bottom surface is substantially equal to a distance between the heater and the inner bottom surface.

7. The microelectromechanical apparatus according to claim 1, wherein when ambient gas pressure around the electrically conductive movable electrode changes, a distance between the electrically conductive movable electrode and the stationary electrode is changed.

8. The microelectromechanical apparatus according to claim 1, wherein the electrical insulation layer is connected with the heater and the electrically conductive movable electrode so that the heater and the electrically conductive movable electrode are electrically insulated from each other.

9. The microelectromechanical apparatus according to claim 8, wherein when ambient gas pressure around the heater changes, a distance between the heater and the stationary electrode is changed.

10. The microelectromechanical apparatus according to claim 1, wherein the sensing module is disposed above the temperature sensor, and the temperature sensor is disposed between the sensing module and the electrically conductive movable electrode.

11. The microelectromechanical apparatus according to claim 1, wherein the sensing module is a gas sensor or a humidity sensor.

12. The microelectromechanical apparatus according to claim 11, wherein the sensing module comprises at least one sensing electrode and a sensing material layer, the at least one sensing electrode and the sensing material layer are disposed above the heater.

13. The microelectromechanical apparatus according to claim 12, wherein the electrical insulation layer is disposed between the heater and the at least one sensing electrode so that the heater and the at least one sensing electrode are electrically insulated from each other.

14. The microelectromechanical apparatus according to claim 12, wherein the substrate further comprises an integrated circuit disposed on the upper surface, and the integrated circuit is electrically connected to the stationary electrode, the electrically conductive movable electrode, and the heater.

15. A microelectromechanical apparatus, comprising:
   a substrate, comprising:
     an upper surface;
     an inner bottom surface; and
     an inner side surface, surrounding and connecting with the inner bottom surface, wherein the inner side surface and the inner bottom surface define a recess formed by being recessed downwards from the upper surface;
   a pressure sensor, disposed on the recess, comprising:
     a stationary electrode, disposed on the inner bottom surface; and
     an electrically conductive movable electrode, covering the recess, wherein the electrically conductive movable electrode, the inner bottom surface, and the inner side surface define a hermetic chamber;
a gas sensor, disposed on the pressure sensor, and comprising:
  a heater, disposed on the electrically conductive movable electrode and located above the hermetic chamber;
  an electrical insulation layer, disposed between the heater and the electrically conductive movable electrode;
  a sensing electrode, disposed above the heater and electrically insulated from the heater, wherein the heater is disposed between the sensing electrode and the electrically conductive movable electrode; and
  a sensing material layer, covering the sensing electrode; and
a temperature sensor, disposed on the pressure sensor, wherein the temperature sensor is disposed on the electrically conductive movable electrode and located above the hermetic chamber, and the electrical insulation layer is disposed between the temperature sensor and the electrically conductive movable electrode;
wherein the substrate further comprises an integrated circuit electrically connected to the stationary electrode, the electrically conductive movable electrode, the heater, and the temperature sensor;
wherein the integrated circuit is used to control the heater to heat the electrically conductive movable electrode of the pressure sensor; and wherein the integrated circuit receives a first electrical signal sensed by the temperature sensor and a second electrical signal sensed by the stationary electrode and the electrically conductive movable electrode to calibrate a pressure value.

16. The microelectromechanical apparatus according to claim 15, wherein the electrically conductive movable electrode is disposed on the upper surface.

17. The microelectromechanical apparatus according to claim 15, wherein the hermetic chamber is a vacuum hermetic chamber.

18. The microelectromechanical apparatus according to claim 15, wherein the hermetic chamber contains gas having a gas pressure smaller than ambient gas pressure around the microelectromechanical apparatus.

19. The microelectromechanical apparatus according to claim 15, wherein a distance between the temperature sensor and the inner bottom surface is substantially equal to a distance between the heater and the inner bottom surface.

20. The microelectromechanical apparatus according to claim 15, wherein the integrated circuit is electrically connected to the sensing electrode.

21. The microelectromechanical apparatus according to claim 20, wherein the integrated circuit calibrates the pressure value using the first electrical signal sensed by the temperature sensor, the second electrical signal sensed by the stationary electrode and the electrically conductive movable electrode, and a data table stored in the integrated circuit.

* * * * *